United States Patent

Nishiwaki et al.

Patent Number: 6,147,438
Date of Patent: *Nov. 14, 2000

[54] PIEZOELECTRIC FILM ELEMENT AND MANUFACTURING METHOD THEREOF, AND INK JET RECORDING HEAD

[75] Inventors: Tsutomu Nishiwaki; Masami Murai, both of Nagano-ken; Kazuo Hashimoto; Toshihiko Anno, both of Yamaguchi-ken, all of Japan

[73] Assignees: Seiko Epson Corporation, Tokyo; Ube Industries, Ltd., Yamaguchi, both of Japan

[*] Notice: This patent issued on a continued prosecution application filed under 37 CFR 1.53(d), and is subject to the twenty year patent term provisions of 35 U.S.C. 154(a)(2).

[21] Appl. No.: 09/100,882

[22] Filed: Jun. 22, 1998

[30] Foreign Application Priority Data

Jun. 20, 1997 [JP] Japan ................................ 9-164280
Apr. 24, 1998 [JP] Japan ................................ 10-115093

[51] Int. Cl.[7] .................................................. H01L 41/08
[52] U.S. Cl. ............................................ 310/363; 310/364
[58] Field of Search ................................ 310/363, 364

[56] References Cited

U.S. PATENT DOCUMENTS

| 5,714,194 | 2/1998 | Komai et al. ................ 427/81 |
| 5,802,686 | 9/1998 | Shimada et al. ............. 29/25.35 |
| 6,013,970 | 1/2000 | Nishiwaki et al. ........... 310/330 |

FOREIGN PATENT DOCUMENTS

| 6-112504 | 4/1994 | Japan ................. H01L 29/788 |
| 6-283706 | 10/1994 | Japan ................ H01L 29/40 |
| 8-230181 | 9/1996 | Japan ................. B41J 2/045 |

*Primary Examiner*—Thomas M. Dougherty
*Attorney, Agent, or Firm*—Sughrue, Mion, Zinn, Macpeak & Seas, PLLC

[57] ABSTRACT

The present invention provides a piezoelectric film element with improved adhesion between a first protective film and a substrate. This invention also provides a method of manufacturing a piezoelectric film element, which makes it possible to selectively form, by a hydrothermal synthesis, a piezoelectric film with excellent piezoelectric properties in a specified area. This piezoelectric element comprises, over a substrate 12: a piezoelectric film; a common electrode and an individual electrode located to hold the piezoelectric film in between; a first protective film 14 which is formed over almost the entire surface of the substrate 12 and which protects the substrate 12 to avoid the formation of the piezoelectric film directly over the substrate 12; and a base film 16 which is formed over the first protective film 14 in the area for forming the piezoelectric film, and which functions as a base when the piezoelectric film is caused to grow to be formed. The piezoelectric film is formed over the base film 16.

13 Claims, 9 Drawing Sheets

A SAMPLE OF A Ni ELECTROFORMING-Ti-Au PATTERN OBTAINED
BY ETCHING Au AFTER THE FORMATION OF SEED CRYSTAL AND
BY CAUSING THE CRYSTAL GROWTH OF PZT (200 MAGNIFICATIONS)

A SAMPLE OF A Ni ELECTROFORMING-Ti-Au PATTERN OBTAINED
BY ETCHING Au AFTER THE FORMATION OF SEED CRYSTAL AND
BY CAUSING THE CRYSTAL GROWTH OF PZT (1000 MAGNIFICATIONS)

PIEZOELECTRIC FILM ELEMENT AND MANUFACTURING METHOD THEREOF, AND INK JET RECORDING HEAD

BACKGROUND OF THE INVENTION

1. Field of the Invention

The present invention relates to a piezoelectric film element used as a micro-actuator for, for example, an ink jet recording head or a micro-pump, and a method of manufacturing such a piezoelectric film element, and an ink jet recording head using the piezoelectric film element as a drive source for discharging ink. More particularly, this invention relates to a piezoelectric film element concerning which a piezoelectric film with excellent piezoelectric properties can be selectively formed by a hydrothermal synthesis, and a method of manufacturing such a piezoelectric film element, and an ink jet recording head using the piezoelectric film element as a drive source.

2. Description of the Related Art

As an element for converting electric energies into mechanical energies, a piezoelectric film element is known which is constructed in a manner such that a piezoelectric film is held between a lower electrode as a common electrode and an upper electrode as an individual electrode.

This piezoelectric film element is used, for example, as an actuator for, for example, an ink jet recording head. When the piezoelectric film element is used, for example, as an actuator for an ink jet recording head, a piezoelectric film is normally required to have a film thickness ranging approximately from 1 µm to 10 µm.

As the piezoelectric film, for example, a film made of lead zirconate titanate (hereinafter referred to as a "PZT" film) is used in general. This PZT film is manufactured by a physical vapor deposition (PVD) method such as sputtering, a chemical vapor deposition (CVD) method, a spin coating method such as a sol-gel method, or a hydrothermal synthesis method.

Among these film-forming methods, the use of the hydrothermal synthesis has often been examined recently because it is possible to make a reaction proceed in a low temperature environment at 200° C. or lower and to inhibit the generation of cracks.

As stated in "Preparation of PZT Crystal Film by Hydrothermal Synthesis and Electrical Properties Thereof" from lecture proceedings (published on Oct. 2, 1995) of the 15$^{th}$ Electronic Material Studies and Symposium held by the Ceramic Society of Japan, this hydrothermal synthesis comprises: a seed crystal forming process for causing PZT seed crystal to be deposited on the surface of a titanium metal substrate; and a crystal growing process for causing PZT crystal to be deposited and to grow over the PZT seed crystal.

More specifically, the official gazette of the Japanese Laid-Open (Kokai) Publication No. HEI 8-306980 discloses a method of manufacturing a piezoelectric element unit by utilizing this thermal synthesis. It is described that as a first step thereof, a titanium film is formed by a mask film forming method of forming a film only at a specified position of a substrate which does not contain titanium, or a titanium film is formed over the entire surface of the substrate, then the titanium film is caused to remain only at portions where PZT is formed by a photo-etching method. Thereby, the PZT is formed over the titanium film.

It is described that as a second step, platinum as a protective film is formed over the substrate made of titanium at portions where the PZT film is not formed, or the protective film formed over the entire surface of the substrate undergoes etching in accordance with the pattern for forming the PZT.

According to the above-described hydrothermal synthesis, however, it is inevitable that the PZT seed crystal will be formed also over the protective film. When forming a minute pattern as in the case of an ink jet recording head, since a PZT seed density on the titanium film is higher than a PZT seed density on the protective film, the PZT seed crystal over the titanium film shows a higher growth rate and, therefore, the PZT film obtained as a result of growth of the PZT seed crystal on the titanium film connects with the PZT film obtained as a result of growth of the PZT seed crystal on the protective film, thereby causing a problem in that the protective film and the PZT film formed thereon cannot be removed. Consequently, there is a problem in that the PZT film cannot be formed selectively in a specified area.

When the substrate is made of electroformed nickel, if gold or the like is used as a material for forming the protective film, a local battery is formed between gold and nickel upon wet etching of the protective film and then nickel suffers electrolytic corrosion, thereby causing a problem in that the dimensional precision lowers.

Particularly the piezoelectric unit element described in the official gazette of the Japanese Laid-Open (Kokai) Publication No. HEI 8-306980 has the following problems. As a first problem, when the protective film has undergone patterning by means of etching and when a PZT element is formed by utilizing a hydrothermal reaction, an alkali solution used in the hydrothermal reaction or an etching reagent penetrates through openings of the protective film into the inside of the protective film, thereby causing deterioration of adhesion between the protective film and the substrate and giving rise to a possibility that the protective film may come off from the substrate.

As a second problem of this example of the prior art, when the thickness of a platinum film as the protective film is thin, the platinum film fails to fulfill its function as the protective film and the PZT seed crystal will be deposited on platinum, so that such a minute pattern will not be formed as the ink jet recording head would demonstrate.

SUMMARY OF THE INVENTION

It is the aim of the present invention to solve the above-described conventional problems. It is an object of this invention to provide a piezoelectric film element, which has improved adhesion between a first protective film and a substrate, and concerning which a piezoelectric film with excellent piezoelectric properties can be selectively formed in a specified area, as well as a method of manufacturing such a piezoelectric film element and an ink jet recording head which uses such a piezoelectric film element as its drive source.

It is another object of this invention to provide a piezoelectric film element with a minute pattern of a piezoelectric film formed thereon just like that of an ink jet recording head, and a method of manufacturing such a piezoelectric film element and an ink jet recording head which uses such a piezoelectric film element as its drive source.

It is a further object of this invention to provide a piezoelectric film element concerning which a piezoelectric film with excellent piezoelectric properties can be selectively formed in a specified area without lowering the dimensional precision of a substrate when electroformed nickel is used for the substrate, as well as a method of manufacturing such a piezoelectric film element and an ink jet recording head which uses such a piezoelectric film element as its drive source.

In order to attain these objects, this invention provides a piezoelectric film element comprising over a substrate:

a piezoelectric film; and a common electrode and an individual electrode located so as to hold the piezoelectric film in between, wherein it is designed to cause deformation of the piezoelectric film by energizing the piezoelectric film through the common electrode and the individual electrode, wherein the piezoelectric film element is characterized in that it comprises:

a first protective film formed over almost the entire surface of the substrate and for protecting the substrate to avoid the formation of the piezoelectric film directly over the substrate; and a base film formed over the first protective film in the area for forming the piezoelectric film, and functioning as a base when the piezoelectric film is caused to grow to be formed, and wherein the piezoelectric film element is also characterized in that the piezoelectric film is formed over the base film.

This invention can have such a construction that the first protective film is made the common electrode and the individual electrode is formed over the piezoelectric film.

The base film can be made the film for forming seed crystal for the piezoelectric film.

The piezoelectric film can be composed of a PZT film formed by utilizing a hydrothermal synthesis, and the base film can be composed of a titanium film for forming seed crystal for the PZT film.

The first protective film can be made of gold, platinum or iridium.

Moreover, the first protective film can be formed with such a film thickness that almost no seed crystal for the piezoelectric film will be formed over its surface.

The first protective film can be made of platinum and can be composed with a film thickness of 50 nm or more.

This invention also provides a piezoelectric film element comprising, over a substrate: a piezoelectric film; and a common electrode and an individual electrode located so as to hold the piezoelectric film in between, wherein it is designed to cause deformation of the piezoelectric film by energizing the piezoelectric film through the common electrode and the individual electrode, and wherein the substrate is made by electroforming, and amorphous nickel is formed over the surface of the substrate.

Furthermore, this invention provides a method of manufacturing a piezoelectric film element, the piezoelectric film element comprising, over a substrate: a piezoelectric film; and a common electrode and an individual electrode located so as to hold the piezoelectric film in between, wherein it is designed to cause deformation of the piezoelectric film by energizing the piezoelectric film through the common electrode and the individual electrode, the manufacturing method comprising the steps of: forming, over almost the entire surface of the substrate, a first protective film for protecting the substrate so as to avoid the formation of the piezoelectric film directly over the substrate; forming, over the first protective film in the area for forming the piezoelectric film, a base film functioning as a base when the piezoelectric film is caused to grow to be formed; and forming the piezoelectric film over the base film.

This invention further provides a method of manufacturing a piezoelectric film element, the piezoelectric film element comprising, over a substrate: a piezoelectric film; and a common electrode and an individual electrode located so as to hold the piezoelectric film in between, wherein it is designed to cause deformation of the piezoelectric film by energizing the piezoelectric film through the common electrode and the individual electrode, the manufacturing method comprising the steps of: forming, over almost the entire surface of the substrate, a first protective film for protecting the substrate so as to avoid the formation of the piezoelectric film directly over the substrate; forming, over the first protective film, a base film functioning as a base when the piezoelectric film is caused to grow to be formed; forming a second protective film, which is resistant to alkali, over the base film in an area other than the area for forming the piezoelectric film; forming seed crystal for the formation of the piezoelectric film over the substrate with the second protective film formed thereon; removing the second protective film from the substrate with the seed crystal formed thereon; and causing crystal growth of the seed crystal after removing the second protective film.

This manufacturing method can further comprise the steps of: forming, after the formation of the seed crystal, a third protective film for protecting the seed crystal formed over the area for forming the piezoelectric film; and removing the second protective film after the formation of the third protective film, and then removing the third protective film.

The base film can be formed with a film for forming the seed crystal upon the formation of the piezoelectric film.

The piezoelectric film can be formed by utilizing a hydrothermal synthesis, and the base film can be formed with a titanium film for forming seed crystal for the PZT film formed by the hydrothermal synthesis.

The second protective film can be made of gold. Since the seed crystal for forming the piezoelectric film can be barely formed on the second protective film made of gold, it is possible to easily remove the second protective film by means of wet etching after the formation of the seed crystal.

Moreover, the substrate can be composed of electroformed nickel, copper or iron. In this case, it is possible to form an amorphous nickel film over the surface of the electroformed nickel. Since the amorphous nickel is a non-crystalline material and does not have a crystal grain boundary, it presents excellent corrosion resistance. When the second protective film is formed with a metal material such as gold, this metal material and nickel will never form a local battery upon wet etching of the second protective film. Accordingly, the electroformed substrate will not suffer electrolytic corrosion, but will keep a high dimensional precision.

This invention also provides a method of manufacturing a piezoelectric film element, the piezoelectric film element comprising over a substrate: a piezoelectric film; and a common electrode and an individual electrode located so as to hold the piezoelectric film in between, wherein it is designed to cause deformation of the piezoelectric film by energizing the piezoelectric film through the common electrode and the individual electrode, the manufacturing method comprising the steps of: forming, over a titanium film formed over the substrate, seed crystal for the formation of the piezoelectric film by a hydrothermal synthesis; selectively forming a resist over the seed crystal in the area for forming the piezoelectric film and selectively removing the seed crystal by using the resist as a mask; and removing the resist after the step of selectively removing the seed crystal, and then causing crystal growth of the seed crystal by the hydrothermal synthesis.

Moreover, this invention provides a method of manufacturing a piezoelectric film element, the piezoelectric film element comprising, over a substrate: a piezoelectric film; and a common electrode and an individual electrode located so as to hold the piezoelectric film in between, wherein it is designed to cause deformation of the piezoelectric film by energizing the piezoelectric film through the common electrode and the individual electrode, the manufacturing method comprising the steps of: forming, over a titanium film formed over the substrate, seed crystal for the formation of the piezoelectric film by a hydrothermal synthesis; selectively forming a resist over the seed crystal in the area for forming the piezoelectric film and selectively removing titanium with the seed crystal formed thereon by using the resist as a mask; and removing the resist after the step of selectively removing the titanium, and then causing crystal growth of the seed crystal by the hydrothermal synthesis.

Furthermore, this invention provides a piezoelectric film element formed by a manufacturing method described in any one of claims 9 through 20, wherein the substrate is made by electroforming and amorphous nickel is formed over the surface of the substrate.

This invention further provides an ink jet recording head using, as a drive source for discharging ink, a piezoelectric film element described in any one of claims 1 through 8 and 21.

The "entire surface" herein used concerning this invention should not be construed in a limited sense to mean the complete entire surface of the substrate. It indicates the area within the section where the piezoelectric film is formed over the substrate. Moreover, the base film is the film for assisting the selective formation of the piezoelectric film over the protective film, for example, as described in the claims of this invention.

DESCRIPTION OF THE PREFERRED EMBODIMENTS

Embodiments of this invention are hereinafter explained with reference to drawings.

Embodiment 1

Figure 1:
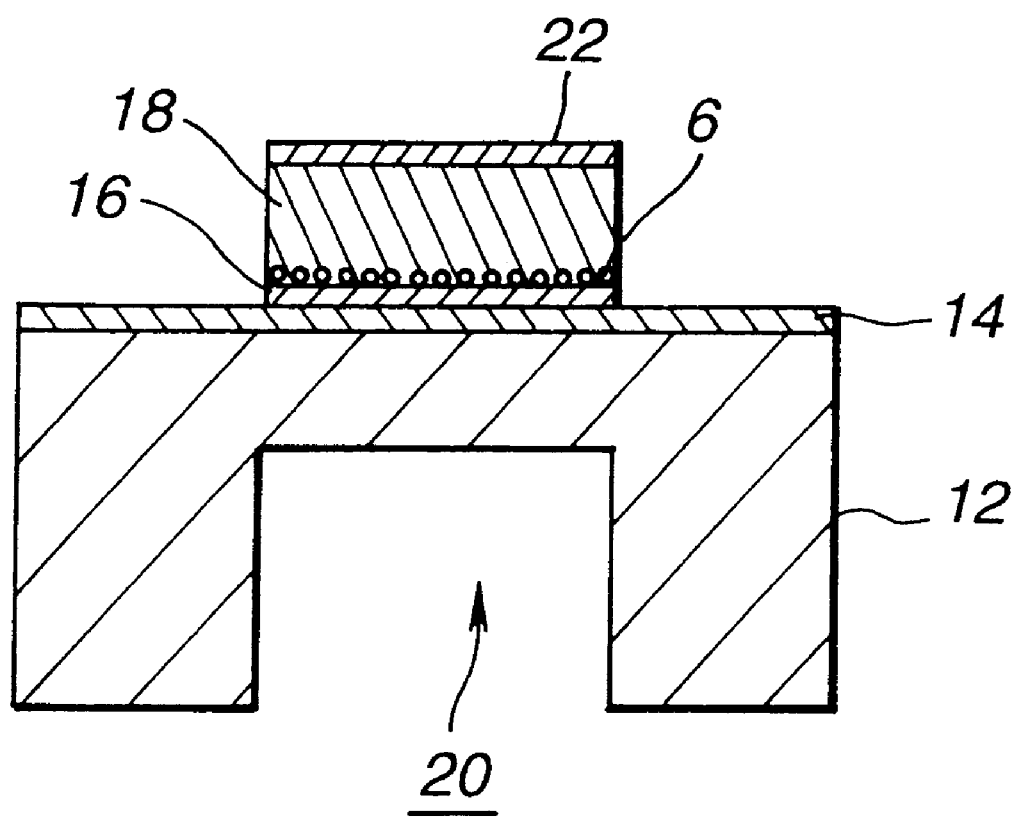
FIG. 1 is a sectional view of a piezoelectric film element according to Embodiment 1 of this invention.

FIG. 1 shows a sectional structure of a piezoelectric film element. This piezoelectric film element is used for an ink jet recording head. A piezoelectric film 18 is located above an ink cavity 20. The structure of this piezoelectric film element is hereinafter explained by referring to the steps of manufacturing the piezoelectric film element.

A first protective film 14 made of platinum is formed over the entire surface of a substrate (e.g. an electroformed nickel substrate) 12. This first protective film 14 is formed with a preferred film thickness of 50 nm or more. Particularly, it is preferred that the film thickness be 100 nm or more. A preferred upper limit of the film thickness of the first protective film is 1 $\mu$m or less, under the circumstance of which platinum has a low membrane stress. The first protective film is formed by, for example, sputtering. As for specific conditions of sputtering, the film is formed with a film thickness of 200 nm by using a DC sputtering device at a substrate heating temperature of 150° C. and with an output of 1000 W.

A base film 16 made of titanium is then formed over the entire surface of the first protective film 14 made of platinum. Platinum can prevent the seed crystal for PZT described later from being formed over the substrate beyond a specified pattern. Titanium causes the seed crystal for PZT to be deposited and also causes a PZT film to grow and be formed by using such seed crystal as the nucleus. As the seed crystal for PZT, seed crystal with Sr or Ba substituted for a part of Pb from PZT can be used. The titanium film can be formed also by means of sputtering as in the case of the first protective film 14. The film thickness of the titanium film is about 0.5–1 $\mu$m.

Etching is then performed on the titanium film with a mixed solution of aqueous hydrogen peroxide and ammonia in a specific pattern, that is, the pattern that will leave the titanium film above the ink cavity 20, on the basis of photolithography which utilizes a resist. Then, the PZT seed crystal is formed on the titanium film 16 over the substrate 12 by the following method.

An aqueous lead nitrate solution (Pb(No$_3$)$_2$), an aqueous zirconium oxychloride solution (ZrOCl$_2$), an aqueous titanium tetrachloride solution (TiCl$_4$) and an aqueous potassium hydroxide solution and, if necessary, an aqueous solution of strontium nitrate or barium chloride are mixed and adjusted to obtain a reaction solution. The above-described substrate is dipped in the reaction solution and a hydrothermal treatment is performed at a temperature of 140° C.

In this reaction, a Ti source eluted from the titanium film 16 and a Ti source in the reaction solution are caused to react to a Pb source and a Zr source in the reaction solution, thereby forming the PZT seed crystal (seed crystal for the piezoelectric film) with a thickness of 0.1 $\mu$m over the surface of the titanium film. Since platinum which composes the first protective film 14 does not react to the reaction solution, the PZT seed crystal 6 is formed only over the titanium film 16.

A PZT film 18 is then caused to grow over the PZT seed crystal by means of a hydrothermal synthesis. As a reaction solution to be used in this hydrothermal reaction, a mixture of an aqueous lead nitrate solution ($Pb(No_3)_2$), an aqueous zirconium oxychloride solution ($ZrOCl_2$), an aqueous titanium tetrachloride solution ($TiCl_4$) and an aqueous potassium hydroxide solution (KOH) can be used.

The back side of the substrate 12 with the PZT seed crystal 6 formed thereon is coated with fluororesin. This coated substrate 12 is then put in the above-described reaction solution at a temperature of 150° C. and the hydrothermal treatment is performed for 12 hours. As a result, the PZT film has grown to become 10 $\mu$m thick.

Since the above-described series of steps do not contain a step of etching the first protective film 14, an etching reagent or an alkali solution used in the hydrothermal synthesis does not penetrate through openings in the first protective film 14. Accordingly, adhesion between the first protective film 14 and the substrate 12 will not deteriorate. Therefore, it is possible to selectively form the PZT film only over the titanium film.

Film lamination and formation of an individual electrode (or upper electrode) 22 over the PZT film will complete an ink jet recording printer head. A lower electrode of this head is platinum which has electrical conductivity, that is, the first protective film 14. In other words, with the piezoelectric film element according to Embodiment 1, the first protective film 14 also functions as the lower electrode.

The electroformed nickel substrate is used as the substrate 12. However, without limitation to such use, a silicon substrate, a processed form of other metal or ceramics, or a molded form of high polymer materials such as polysulfone can be used.

Adhesively attaching a nozzle plate, which has a nozzle opening for discharging ink from the ink cavity, on the side of the ink cavity of the substrate 12 will complete an ink jet recording head.

When etching of the first protective film over the substrate containing titanium is performed in a specified pattern by means of ion milling and the hydrothermal synthesis similar to that described above is applied to form the PZT film, the above-described hydrothermal reaction causes penetration of the reaction solution into gaps between the first protective film and the substrate, causing the first protective film to come off and forming the PZT film at undesired portions. Therefore, it is difficult to form a desired minute piezoelectric film.

Figure 2:
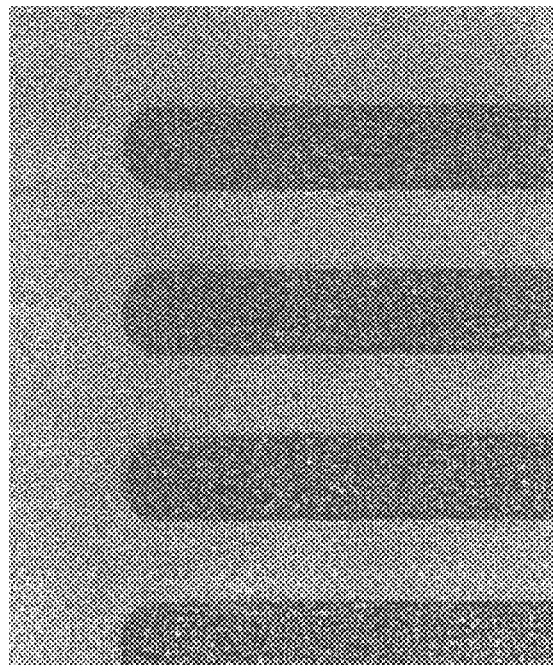
FIG. 2 is a photograph taken with a microscope of 200 magnifications, which shows the piezoelectric film element according to Embodiment 1 of this invention with a Pt film 100 nm thick and with a PZT film formed over a protective film.

On the other hand, when no etching is performed on the first protective film and the titanium film is formed in a specified pattern and the PZT film is then formed to obtain the piezoelectric film, as shown in FIG. 2 (a photograph of an image of 200 magnifications) which shows a plane with a Pt film thickness of 100 nm and with the PZT film formed over the first protective film, separation of the first protective film from the substrate is not caused or the PZT film is not formed at undesired portions.

Figure 3:
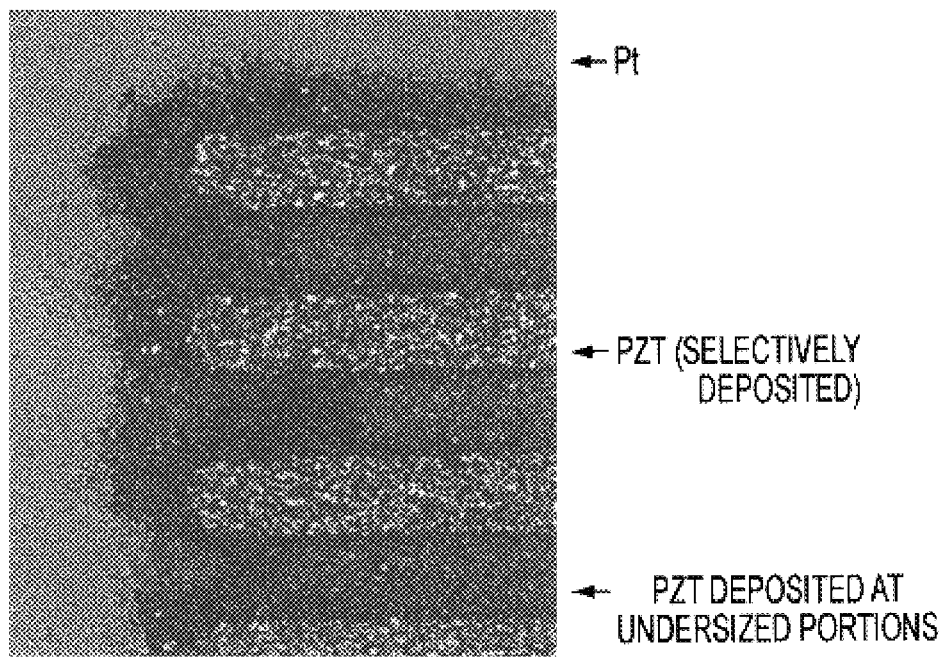
FIG. 3 is a similar microscope photograph of the piezoelectric film element according to Embodiment 1 of this invention, which has a Pt film 30 nm thick.

In the case of FIG. 3 (a photograph of an image of 200 magnifications) showing a plane concerning which the film thickness of Pt, the first protective film, is 30 nm which is less than 50 nm, and the PZT film is formed over the first protective film by applying the hydrothermal synthesis, the PZT film is formed partly over the first protective film. This is possibly because when the film thickness of platinum is thin, platinum sometimes reacts to the reaction solution for the hydrothermal reaction subject to the influence of the unstable film at the time of sputtering.

Embodiment 2

FIG. 4 shows sectional views which illustrate the steps of manufacturing a piezoelectric film element according to Embodiment 2. The steps of manufacturing the piezoelectric film element are hereinafter explained in detail with reference to FIG. 4. Concerning Embodiment 2, the films (or members) similar to those in Embodiment 1 are given the same reference numeral and any detailed description thereof is omitted.

Figure 4A:
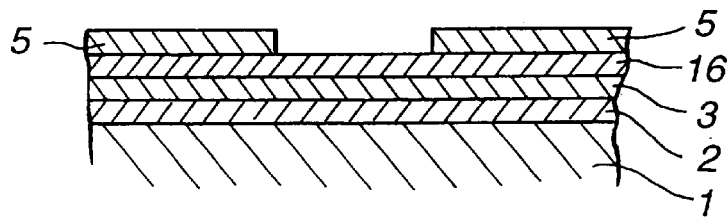
FIGS 4A–4D sectional views which illustrate the steps of manufacturing a piezoelectric film element according to Embodiment 2 of this invention.

In the step shown in FIG. 4A, a lower electrode forming film 3 is formed over a substrate (e.g. a silicon substrate) 1 through a silicon oxide film 2. A base film 16 made of titanium is then formed with a film thickness of about 0.5–1 $\mu$m over the lower electrode forming film 3.

Subsequently, a second protective film 5 made of gold is formed with a film thickness of about 1 $\mu$m over the base film and patterning is then performed by photolithography by using a resist, thereby removing the second protective film 5 in the area for forming the PZT film by using a potassium iodide solution. Thereafter, the resist is peeled off, so that the second protective film 5 made of gold is selectively formed in areas other than the area for forming the PZT film.

Figure 4B:
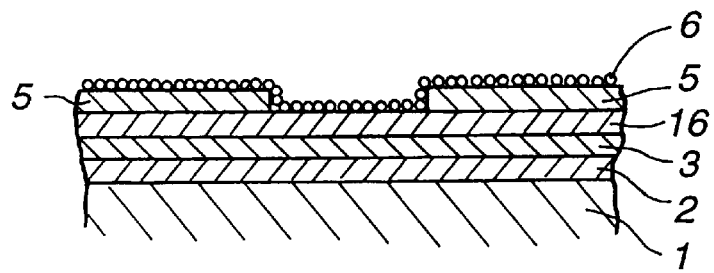

In the step shown in FIG. 4B, PZT seed crystal 6 is formed over the substrate 1 obtained in the step shown in FIG. 4A in the same manner as that of Embodiment 1. At this time, because the Pb source in the reaction solution has active reactivity, the PZT seed crystal 6 is deposited partly over the surface of the second protective film 5.

Figure 4C:
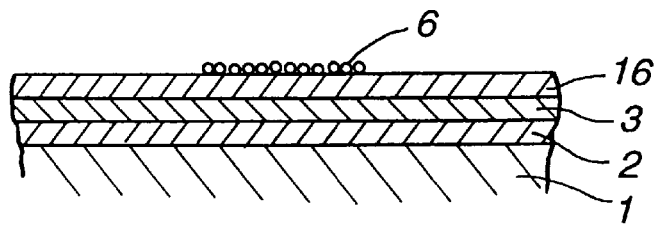

In the step shown in FIG. 4C, the second protective film 5 is removed from the substrate 1 obtained in the step shown in FIG. 4B by means of wet etching with a potassium iodide solution. At this time, the PZT seed crystal 6 formed over the second protective film 5 in the step shown in FIG. 4B is removed together with the second protective film 5. This allows the PZT seed crystal 6 to be formed only in the area for forming the PZT film over the base film 16 formed on the substrate 1.

Figure 4D:
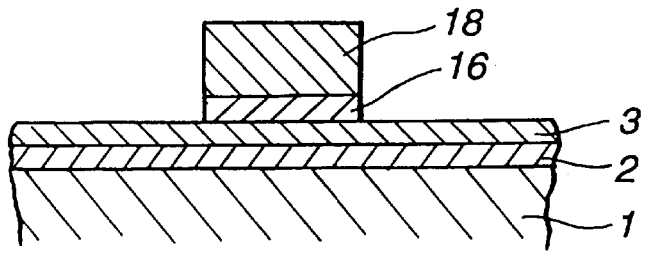

In the step shown in FIG. 4D, a PZT film 18 is caused to grow by means of the hydrothermal synthesis over the PZT seed crystal 6 obtained in the step shown in FIG. 4C. As the reaction solution to be used for this hydrothermal reaction, that used in Embodiment 1 can be utilized.

The back side of the substrate 1 with the PZT seed crystal 6 formed thereon is coated with fluororesin. This coated substrate 1 is then put in the above-described reaction solution at a temperature of 150° C. and the hydrothermal treatment is performed for 12 hours. As a result, the PZT film has grown to become 10 $\mu$m thick. At this time, the base film 16 with no PZT seed crystal formed thereon dissolves in the reaction solution.

As described above, by the method of forming the piezoelectric film element according to this invention, the PZT seed crystal 6 can be formed selectively only over the area for forming the PZT film. As a result, it is possible to selectively form the PZT film 18 in a specified area by means of the hydrothermal synthesis.

Subsequently, an upper electrode forming film is formed and other steps are taken as necessary to obtain the piezoelectric film element.

Concerning Embodiment 2, an explanation has been given about the case where silicon is used as the substrate. However, without limitation to such use, a processed form of metals or ceramics or a molded form of high polymer materials such as polysulfone may be used.

Figure 11:
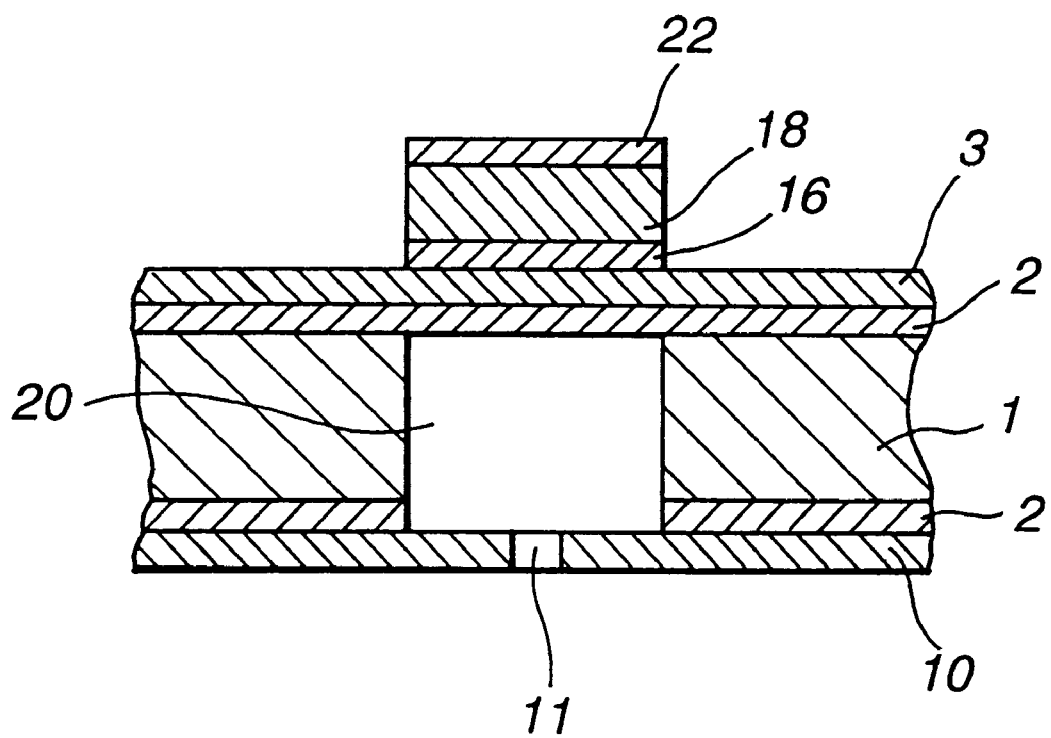
FIG. 11 is a partial sectional view of an ink jet recording head according to Embodiment 2 of this invention.

With an ink jet recording head which uses this piezoelectric film element as an actuator, as shown in FIG. 11, a silicon oxide film 2 serving as a vibrating plate and a lower electrode 3 also serving as a vibrating plate are formed over a first surface of the substrate 1. The PZT film 18 and the upper electrode 22 are formed in a specified area (the area for forming the piezoelectric film element) on the lower electrode 3. The ink cavity 20 is formed at such a portion over the surface (a second surface) opposite to the first surface of the substrate 1 that corresponds to the area where the PZT film 18 is formed. On the second surface of the substrate 1, a nozzle plate 10 with a nozzle opening 11 formed therein for discharging ink from the ink cavity 20 toward outside is provided.

The piezoelectric film element according to Embodiment 2 can be used not only as an actuator for an ink jet recording head, but also as an actuator for a micro-pump or the like. There is no doubt that a piezoelectric film element according to embodiments described below can also be used as an actuator for an ink jet recording head or a micro-pump or the like.

Embodiment 3

Embodiment 3 of this invention is hereinafter explained with reference to the relevant drawings.

FIG. 5 shows sectional views which illustrate the steps of manufacturing a piezoelectric film element according to Embodiment 3. The steps of manufacturing the piezoelectric film element are hereinafter explained in detail with reference to FIG. 5. Concerning Embodiment 3, detailed descriptions of the steps similar to those of Embodiment 2 are omitted and the films (or members) similar to those in Embodiments 1 and 2 are given the same reference numeral.

Figure 5A:
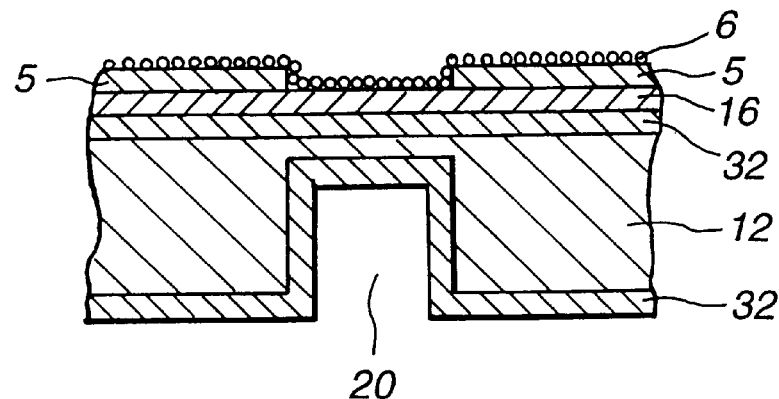
FIGS. 5A–5C sectional views which illustrate the steps of manufacturing a piezoelectric film element according to Embodiment 3 of this invention.

In the step shown in FIG. 5A, an amorphous nickel film 32 is formed with a film thickness of about 1–2 $\mu$m by means of electroforming over the surface of a substrate 12 made of electroformed nickel with an ink cavity 20 formed therein at a specified position. A base film 16 is then formed in the same manner as in Embodiment 1 over the substrate 12 with the amorphous nickel film 32 formed thereon on the surface opposite to the surface where the ink cavity 20 is formed. Subsequently, a second protective film 5 made of gold is selectively formed over the base film 16 at portions other than the area for forming the PZT film. PZT crystal seed 6 is then formed over the second protective film 5 and the base film 16 in the same manner as in Embodiment 1.

Figure 5B:
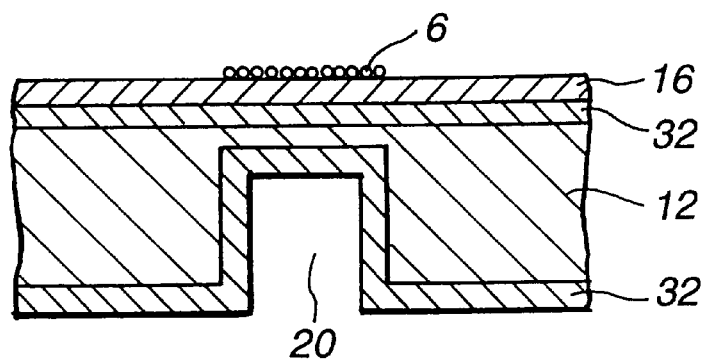

In the step shown in FIG. 5B, the second protective film 5 is removed from the substrate 12 obtained in the step shown in FIG. 5A in the same manner as in Embodiment 2. At this time, there exists the amorphous nickel film 32 formed over the surface of the electroformed nickel which is the substrate 12. Accordingly, a local battery will never be formed between gold and nickel when the second protective film 5 is removed. Therefore, the substrate 12 will not suffer electrolytic corrosion. Consequently, it is possible to secure the dimensional precision of the substrate 12.

Figure 5C:
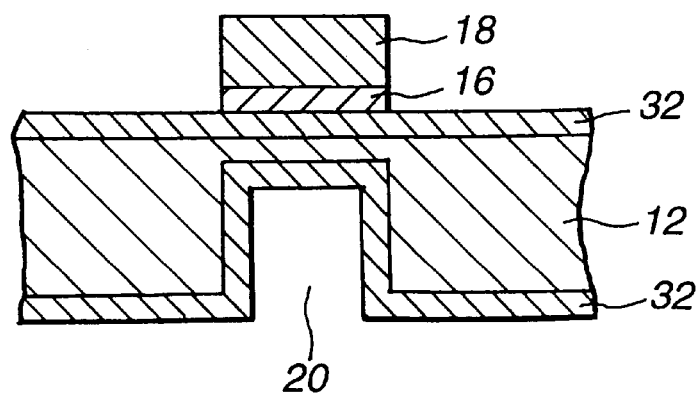

In the step shown in FIG. 5C, a PZT film 18 is formed selectively only in the area for forming the PZT film in the same manner as in Embodiment 2.

Figure 6:
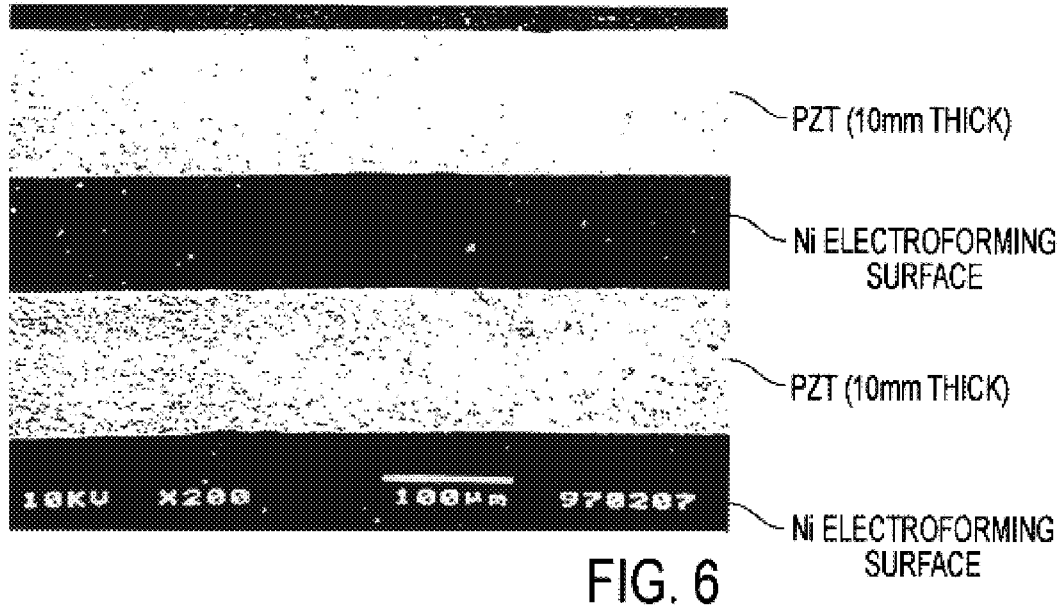
FIG. 6 is a photograph, which was taken by using an SEM (scanning electron microscope), of the surface of a substrate with a PZT film formed thereon according to Embodiment 3.
Figure 7:
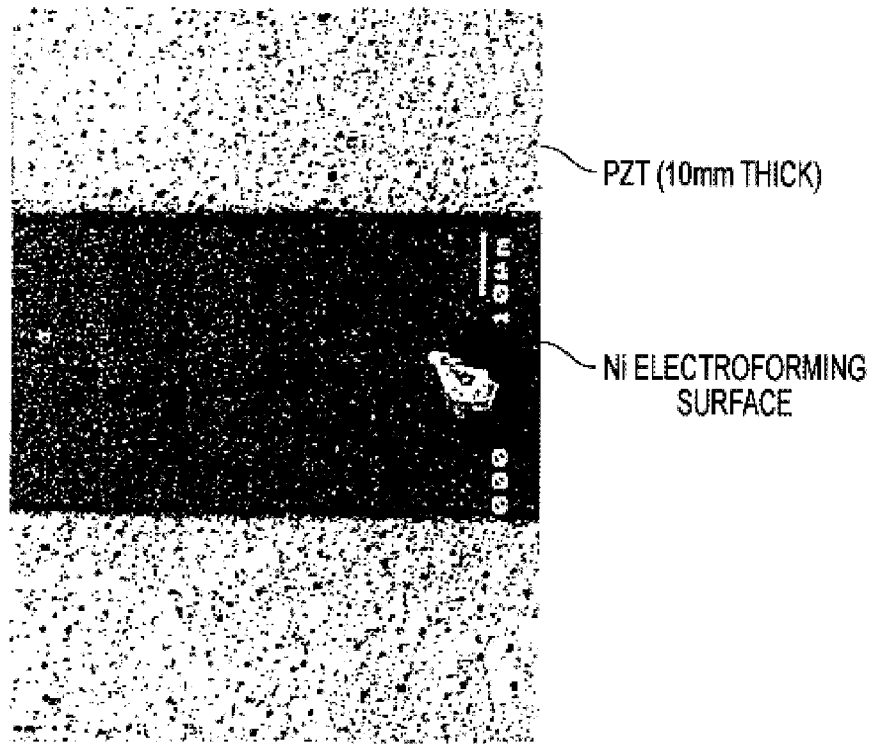
FIG. 7 is a photograph, which was taken by using the SEM, of the surface of a substrate with a PZT film formed thereon according to Embodiment 3.

FIGS. 6 and 7 are photographs of the surface of the substrate 12 obtained in the above-described manner, which were taken by using an SEM (scanning electron microscope). It can be confirmed with these photographs that the PZT film 18 is formed selectively in desired areas.

Subsequently, an upper electrode forming film is formed and other steps are taken as necessary to obtain a piezoelectric film element.

In Embodiment 3, the PZT crystal growing step is performed in one step. However, when the PZT crystal growing step is divided into several steps in order to control a PZT composition, a film thickness, a crystal grain diameter or other factors, it goes without saying that similar effects can be obtained even if the removal of the second protective film 5 is performed in the middle of the crystal growing step.

As a comparison, the PZT film is formed in the same manner as in Embodiment 2 except that the second protective film is not removed after the formation of the PZT seed crystal, but the PZT seed crystal is caused to grow continuously, and then the second protective film is removed by means of etching.

Figure 8:
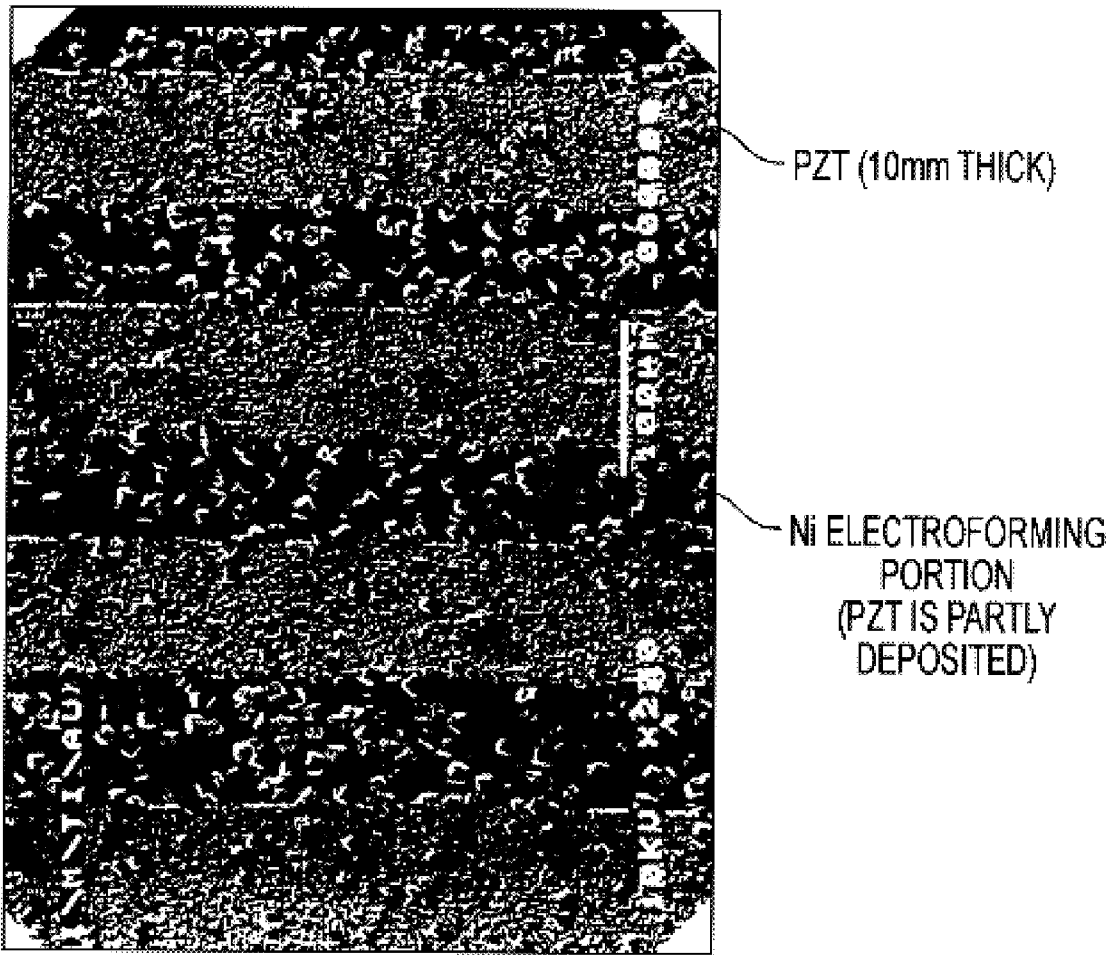
FIG. 8 is a photograph, which was taken by using the SEM, of the surface of a substrate with a PZT film formed thereon according to a comparative example.

FIG. 8 is a photograph, which was taken by using an SEM, of the surface of the substrate (for comparison) with the PZT film formed thereon in the manner described above. It can be confirmed with this photograph that the PZT film is deposited also partly on the substrate (electroformed nickel).

Concerning Embodiment 3, an explanation has been given about the case where nickel is used for the electroformed substrate. However, without limitation to such use, electroformed substrate made of copper or iron may be used.

Embodiment 4

Embodiment 4 of this invention is hereinafter explained with reference to the relevant drawing.

FIG. 9 shows sectional views which illustrate the steps of manufacturing a piezoelectric film element according to Embodiment 4. The steps of manufacturing the piezoelectric film element are hereinafter explained in detail with reference to FIG. 9. Concerning Embodiment 4, detailed descriptions of the steps similar to those of the aforementioned embodiments are omitted and the films (or members) similar to those in the aforementioned embodiments are given the same reference numeral.

Figure 9A:
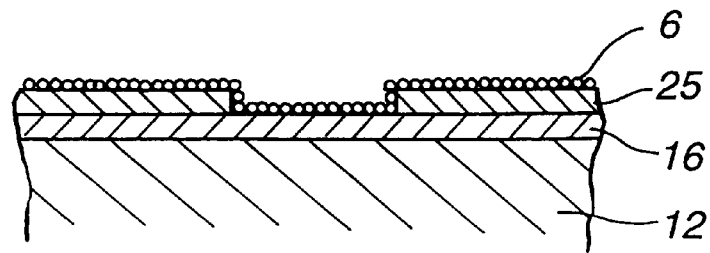
FIGS. 9A–9E shows sectional views which illustrate the steps of manufacturing a piezoelectric film element according to Embodiment 4 of this invention.

In the step shown in FIG. 9A, a base film 16 is formed over a substrate 12 made of electroformed nickel in the same manner as in the aforementioned embodiments. A second protective film 25 made of platinum is then formed selectively at portions other than the area for forming a PZT film over the base film 16. Subsequently, PZT seed crystal 6 is formed in the same manner as in the aforementioned embodiments.

Figure 9B:
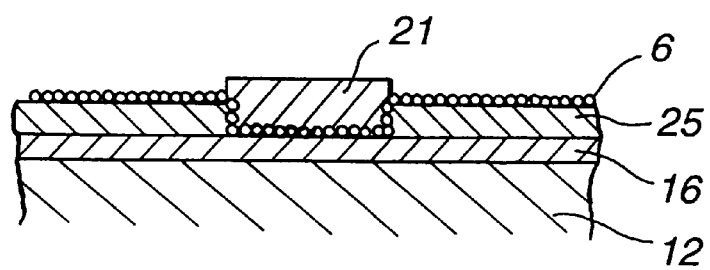

In the step shown in FIG. 9B, a third protective film 21 composed of a resist film is formed selectively in the area for forming the PZT film over the substrate 12 with the PZT seed crystal formed thereon as obtained in the step shown in FIG. 9A. This third protective film 21 fulfills its function to protect the PZT seed crystal 6 formed in the piezoelectric film area when the second protective film 25 is removed in a step described below.

Figure 9C:
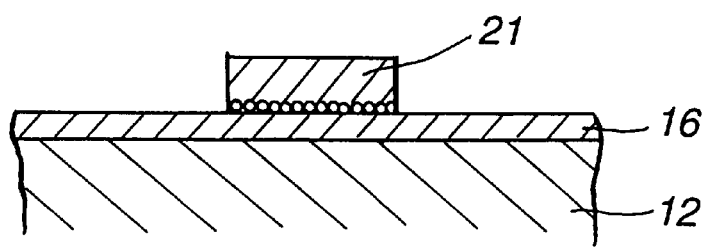

In the step shown in FIG. 9C, the second protective film 25 is removed by means of ion milling by using the third protective film 21 as a mask.

Figure 9D:
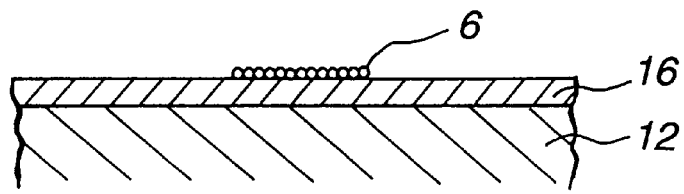

In the step shown in FIG. 9D, the third protective film 21 is removed. Consequently, the PZT seed crystal is selectively formed only in the area for forming the PZT film.

Figure 9E:
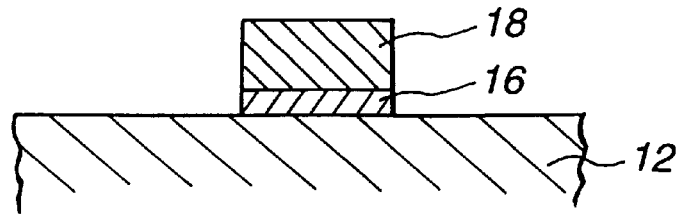

In the step shown in FIG. 9E, the PZT seed crystal 6 is caused to grow and form a PZT film 18 in the same manner as in the aforementioned embodiments.

Subsequently, an upper electrode forming film is formed and other steps are taken as necessary to form a piezoelectric film element.

Concerning Embodiment 4, an explanation has been given about the case where platinum is used as a material for forming the second protective film. However, without limitation to such use, any film which has alkali resistance such as nickel may be applied. It is not particularly limited to metals.

Embodiment 5

Embodiment 5 of this invention is hereinafter explained with reference to the relevant drawing.

FIG. 10 shows sectional views which illustrate the steps of manufacturing a piezoelectric film element according to Embodiment 5. The steps of manufacturing the piezoelectric film element are hereinafter explained in detail with reference to FIG. 10. Concerning Embodiment 5, detailed descriptions of the steps similar to those of the aforementioned embodiments are omitted and the films (or members) similar to those in the aforementioned embodiments are given the same reference numeral.

Figure 10A:
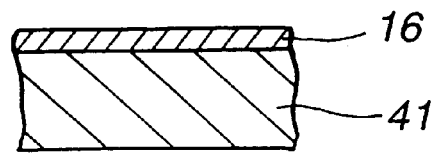
FIGS. 10A–10E sectional views which illustrate the steps of manufacturing a piezoelectric film element according to Embodiment 5 of this invention.

In the step shown in FIG. 10A, a base film 16 is formed with a film thickness of about 0.5–1 μm over a substrate 41 made of nickel.

Figure 10B:
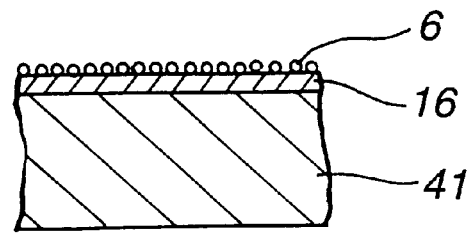

In the step shown in FIG. 10B, PZT seed crystal 6 is formed by means of the hydrothermal synthesis over the base film 16 obtained in the step shown in FIG. 10A.

Figure 10C:
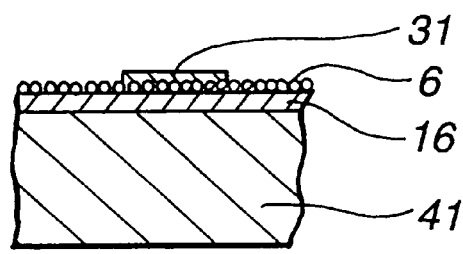

In the step shown in FIG. 10C, a resist 31 is formed selectively by means of photolithography in the area for forming a PZT film over the PZT seed crystal 6 obtained in the step shown in FIG. 10B.

Figure 10D:
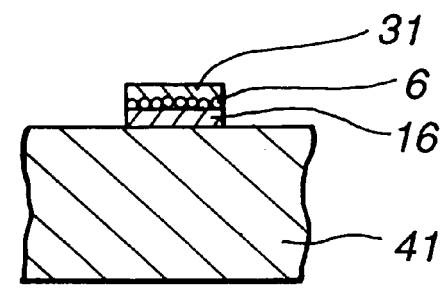

In the step shown in FIG. 10D, a mixed solution of aqueous hydrogen peroxide and ammonium is used and the resist 31 is used as a mask to selectively remove the base film 16 with the PZT seed crystal 6 formed thereon. As a result of this step, the base film 16 and the PZT seed crystal 6 are formed in the area for forming the PZT film over the substrate 41.

Figure 10E:
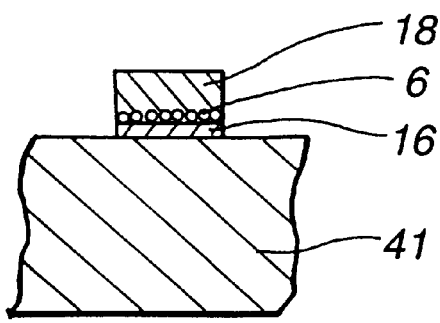

In the step shown in FIG. 10E, the resist film 31 formed in the above-described step is peeled off and the PZT seed crystal 6 is then caused to grow by means of the hydrothermal synthesis, thereby forming a PZT film 18.

According to the above-described steps, it is possible to selectively form the piezoelectric film with excellent piezoelectric properties by means of the hydrothermal synthesis without using the second protective film 5 made of gold or the like as contrasted with the aforementioned embodiments where the second protective film 5 is used.

Concerning Embodiment 5, an explanation has been given about the case where the base film 16 with the PZT seed crystal 6 formed thereon is selectively removed by using the mixed solution of aqueous hydrogen peroxide and ammonium. However, the PZT seed crystal may be selectively removed by means of ion milling.

As described above, this invention can provide a piezoelectric film element with no deterioration of adhesion between the first protective film and the substrate, and a method of manufacturing such a piezoelectric film element. Moreover, it is possible to provide a piezoelectric film element with such a minute piezoelectric film pattern formed thereon as that of an ink jet recording head, and a method of manufacturing such a piezoelectric film element.

Moreover, since this invention can form a minute piezoelectric film element of high precision at a specified position by means of the hydrothermal synthesis, it is possible to obtain a micro-actuator with good characteristics. Because the hydrothermal synthesis includes only low temperature process, the versatility of possible substrate materials to be used and sizes of the substrate is high, thereby it is possible to manufacture a long ink jet recording head like a line head.

When electroforming is used for making the substrate, such an advantageous effect is obtained that the piezoelectric film with excellent piezoelectric properties can be formed selectively in a specified area without lowering the dimensional precision of the substrate.

Furthermore, because coating of amorphous nickel is applied, high dimensional precision and high corrosion resistance can be obtained even if inexpensive electroformed substrate made of copper or iron is used. There is also such an advantageous effect that wettability of the ink cavity with ink improves and corrosion due to ink is prevented.

What is claimed is:

1. A piezoelectric film element comprising, over a substrate:

a piezoelectric film; and a common electrode and an individual electrode located so as to hold said piezoelectric film in between, wherein the piezoelectric film element is designed to cause deformation of said piezoelectric film by energizing said piezoelectric film through said common electrode and said individual electrode, and wherein the substrate is made by electroforming, and amorphous nickel is formed over the surface of the substrate.

2. A piezoelectric film element comprising, over a substrate:

a common electrode, an individual electrode and a piezoelectric film arranged between said common electrode and said individual electrode, a first protective film arranged between the piezoelectric film and the substrate which may be the same as or distinct from the common electrode, said first protective film being formed over almost the entire surface of the substrate for protecting the substrate so as to avoid the formation of said piezoelectric film directly over the substrate, and a base film comprising titanium formed over said protective film in an area for forming said piezoelectric film, wherein said base film is a film for forming seed crystal for said piezoelectric film, and said piezoelectric film is formed on said base film via a layer of seed crystal arranged between the base film and the piezoelectric film.

3. The piezoelectric film element according to claim 2, wherein said first protective film is said common electrode and said individual electrode is formed over said piezoelectric film.

4. The piezoelectric film element according to claim 2, wherein said piezoelectric film is a PZT film formed by hydrothermal synthesis.

5. The piezoelectric film element according to claim 2, wherein said first protective film comprises gold, platinum or iridium.

6. The piezoelectric film element according to claim 2, wherein said first protective film has a film thickness such that almost no seed crystal for the piezoelectric film will be formed over the surface of the first protective film.

7. The piezoelectric film element according to claim 6, wherein said first protective film is made of platinum and has a film thickness of 50 nm or more.

8. The piezoelectric film element according to claim 2, wherein said piezoelectric film element causes deformation of said piezoelectric film by energizing said piezoelectric film through said common electrode and said individual electrode.

9. The piezoelectric film element according to claim 2, wherein said base film functions as a base when said piezoelectric film is caused to grow to be formed.

10. An ink jet recording head using, as a drive source for discharging ink, a piezoelectric film element described in claim 2.

11. A piezoelectric film element comprising, in the following order over a substrate:

a common electrode, a first protective film formed over almost the entire surface of the substrate which may be the same as or distinct from the common electrode, a base film comprising titanium, a piezoelectric film, and an individual electrode, wherein said first protective film is formed over almost the entire surface of the substrate for protecting the substrate so as to avoid the formation of said piezoelectric film directly over the substrate, said base film is formed over said protective film in an area for forming said piezoelectric film, and said piezoelectric film is formed on said base film via a layer of seed crystal for forming said piezoelectric film, said seed crystal being arranged between the base film and the piezoelectric film.

12. The piezoelectric film element according to claim 11, wherein said first protective film is said common electrode and said individual electrode is formed over said piezoelectric film.

13. An ink jet recording head using, as a drive source for discharging ink, a piezoelectric film element described in claim 11.

* * * * *